(12) United States Patent
Howe et al.

(10) Patent No.: US 12,277,963 B2
(45) Date of Patent: Apr. 15, 2025

(54) APPARATUS WITH DATA-RATE-BASED VOLTAGE CONTROL MECHANISM AND METHODS FOR OPERATING THE SAME

(71) Applicant: Lodestar Licensing Group LLC, Evanston, IL (US)

(72) Inventors: Gary L. Howe, Allen, TX (US); Miles S. Wiscombe, Boise, ID (US); James S. Rehmeyer, Boise, ID (US); Eric J. Stave, Meridian, ID (US)

( * ) Notice: Subject to any disclaimer, the term of this patent is extended or adjusted under 35 U.S.C. 154(b) by 0 days.

(21) Appl. No.: 18/403,516

(22) Filed: Jan. 3, 2024

(65) Prior Publication Data
US 2024/0221813 A1 Jul. 4, 2024

Related U.S. Application Data

(63) Continuation of application No. 17/939,908, filed on Sep. 7, 2022, now Pat. No. 11,881,245, which is a continuation of application No. 17/094,731, filed on Nov. 10, 2020, now Pat. No. 11,462,254.

(51) Int. Cl.
| | | |
|---|---|---|
| G11C 11/4076 | (2006.01) | |
| G11C 5/04 | (2006.01) | |
| G11C 5/14 | (2006.01) | |
| G11C 11/406 | (2006.01) | |
| G11C 11/4074 | (2006.01) | |

(52) U.S. Cl.
CPC ............. *G11C 11/406* (2013.01); *G11C 5/04* (2013.01); *G11C 5/14* (2013.01); *G11C 11/4074* (2013.01); *G11C 11/4076* (2013.01)

(58) Field of Classification Search
CPC .......... G11C 5/04; G11C 5/14; G11C 11/406; G11C 11/4074; G11C 11/4076
See application file for complete search history.

(56) References Cited

U.S. PATENT DOCUMENTS

| | | | |
|---|---|---|---|
| 7,042,776 B2 | 5/2006 | Canada et al. | |
| 7,184,327 B2* | 2/2007 | Choi | G11C 11/40618 |
| | | | 365/189.08 |
| 9,395,775 B2 | 7/2016 | Takayanagi et al. | |
| 9,541,992 B2* | 1/2017 | Lee | G06F 1/3296 |
| 9,786,356 B2* | 10/2017 | Wang | G11C 29/021 |
| 9,870,043 B2* | 1/2018 | Lee | G11C 11/419 |
| 9,891,855 B2* | 2/2018 | Yang | G06F 3/0614 |
| 10,383,062 B2 | 8/2019 | Heo et al. | |
| 10,916,274 B2 | 2/2021 | Lee et al. | |
| 2018/0032124 A1* | 2/2018 | Fukuoka | G06F 1/3296 |
| 2022/0148638 A1 | 5/2022 | Howe et al. | |
| 2023/0273668 A1* | 8/2023 | Oh | G11C 11/4072 |
| | | | 713/323 |

\* cited by examiner

*Primary Examiner* — Son L Mai

(57) ABSTRACT

Methods, apparatuses, and systems related to voltage management of memory apparatuses/systems are described. The memory device can include circuitry configured to determine an operating frequency of a clock signal for an ongoing or an upcoming memory operation. The memory device may generate a control indicator for increasing a system voltage for higher operating frequencies, for decreasing the system voltage for lower operating frequencies, or a combination thereof.

19 Claims, 5 Drawing Sheets

APPARATUS WITH DATA-RATE-BASED VOLTAGE CONTROL MECHANISM AND METHODS FOR OPERATING THE SAME

CROSS-REFERENCE TO RELATED APPLICATION(S)

This application is a continuation of U.S. patent application Ser. No. 17/939,908, filed Sep. 7, 2022, which is a continuation of U.S. patent application Ser. No. 17/094,731, filed Nov. 10, 2020, each of which is incorporated herein by reference in its entirety.

TECHNICAL FIELD

The disclosed embodiments relate to devices, and, in particular, to an apparatus with a voltage control mechanism that is data-rate dependent and methods for operating the same.

BACKGROUND

Memory devices may be provided as modules with standard physical formats and electrical characteristics to facilitate easier installation and deployment across multiple computing systems. One such module is a dual in-line memory module (DIMM), which is frequently used to provide volatile memory such as dynamic random-access memory (DRAM) to computing systems. Because DRAM can be fast, DRAM-based memory systems are well-suited to be used as the main memory of computing systems. Some memory systems, such as a non-volatile dual in-line memory module (NVDIMM), additionally include non-volatile memory (e.g., Flash memory) along with the DRAM.

Technological improvements for the computing systems and the devices/subsystems therein (e.g., the memory system) are often associated with increasing the operating speed and/or decreasing the size/footprint of the circuits therein. For memory systems, the improvements can be achieved by increasing the density of the memory circuits and/or the operating speed (e.g., a clock speed). However, increasing the density and/or the operating speed may provide increasing challenges for managing power, performance, and/or error.

DETAILED DESCRIPTION

As described in greater detail below, the technology disclosed herein relates to an apparatus, such as for memory systems, systems with memory devices, related methods, etc., for managing voltage levels of the apparatus according to data rate of operations performed by the apparatus. The apparatus (e.g., a DRAM, a DIMM, a system including the DRAM/DIMM, and/or a portion thereof) can include a voltage-speed management circuit (e.g., logic) configured to dynamically adjust a system-internal voltage level according to a data rate associated with a commanded/requested memory operation.

Unlike conventional memory systems that are typically programmed at production to provide a single supply level for all operating modes/frequencies, embodiments of the present technology are configured to dynamically vary the supply level to memory circuits according to ongoing and/or upcoming operations. For example, a memory system (e.g., a double data rate 5 (DDR5) DIMM) can include a power management integrated circuit (PMIC) configured to provide operating voltage to the DRAM within the system. The PMIC and/or the DRAM can include circuitry that form the voltage-speed management circuit configured to dynamically adjust the operating voltage supplied to the DRAM. The voltage-speed management circuit can determine an operating speed (e.g., a data rate) for the ongoing and/or upcoming operations. Based on the determination, the voltage-speed management circuit can generate a voltage control indicator (e.g., a command/setting for the supply level and/or a voltage feedback). The voltage-speed management circuit (at, e.g., the PMIC) can process the voltage control indicator and adjust the supply levels accordingly. The voltage-speed management circuit can increase the supply level to achieve and/or improve higher speed performance of the DRAM. Also, the voltage-speed management circuit can reduce the supply level and the corresponding power consumption when the higher speed performance is not required by the ongoing/upcoming operations.

In the following description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with semiconductor devices are not shown, or are not described in detail, to avoid obscuring other aspects of the technology. In general, it should be understood that various other devices, systems, and methods in addition to those specific embodiments disclosed herein may be within the scope of the present technology.

Figure 1:
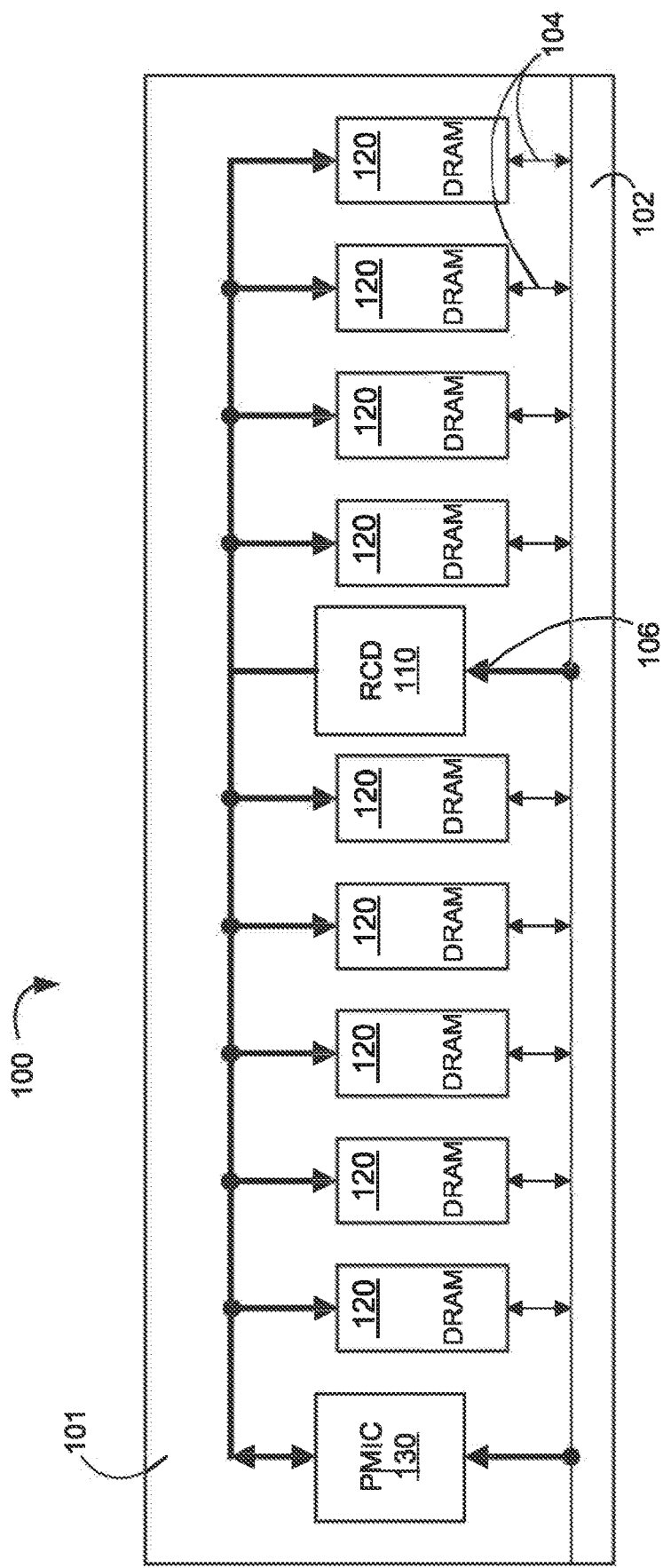
FIG. 1 illustrates an example environment in which an apparatus may operate in accordance with an embodiment of the present technology.

FIG. 1 schematically illustrates a DIMM 100 including a plurality of DRAM 120 (e.g., memory dies, memory chips, memory packages or the like). The DIMM 100 includes an edge connector 102 along an edge of a substrate 101 (e.g., a printed circuit board (PCB) or the like) of the DIMM 100 for connecting a data bus 104 and a service bus 106 (illustrated in bold lines) to a host device. The data bus 104 connects the DRAM 120 to the edge connector 102 and receives data signals from and transmits data signals to a connected host during memory access operations (e.g., reads and writes). The service bus 106 includes electrical connections configured to communicate information associated with the data communicated over the data bus 104. For example, the service bus 106 can include a command bus and/or an address bus. The service bus 106 can further include connections for communicating control information used to dynamically adjust the amount/level of power/voltage on the corresponding connection. The substrate 101 can include voltage connections (e.g., a plane, a set of dedicated traces, a set of vias, etc.) for supplying voltage to circuits thereon. Details regarding the dynamic adjustment of the voltage and the corresponding circuitry are described below.

The DIMM 100 further includes control circuitry, such as a registering clock driver (RCD) 110. The RCD 110 can include circuitry configured to receive command/address signals from the service bus 106 and generate memory command/address signals for the DRAM 120. The RCD 110 can present a predictable electrical load (e.g., for matching impedance, reactance, capacitance, etc.) to the host device and can re-drive memory command/address signals to the DRAM 120, which helps enable higher densities and increase signal integrity. The RCD 110 may also buffer the command/address signals provided by the host, and then transmit the buffered signals as memory command/address signals to the DRAM 120.

The DIMM 100 can further include a PMIC 130 configured to provide granular system power/voltage loading. For example, DDR5 DIMM can include the PMIC 130 that receives external power (e.g., 12V) and distributes internal voltage (e.g., 1.1V $V_{DD}$) supply). The PMIC 130 can be configured to stabilize the internal voltage across varying or fluctuating levels of the external voltage. The PMIC 130 can provide the internal voltage to the DRAM 120 over the voltage connections on the substrate 101. In some embodiments, the PMIC 130 can further receive control-related information from the DRAM 120 to adjust the internal voltage levels (e.g., onboard supply levels). As described in detail below, the DRAM 120 and/or the PMIC 130 can include circuitry configured to dynamically adjust the internal voltage levels according to targeted performance levels (e.g., data rates).

Figure 2:
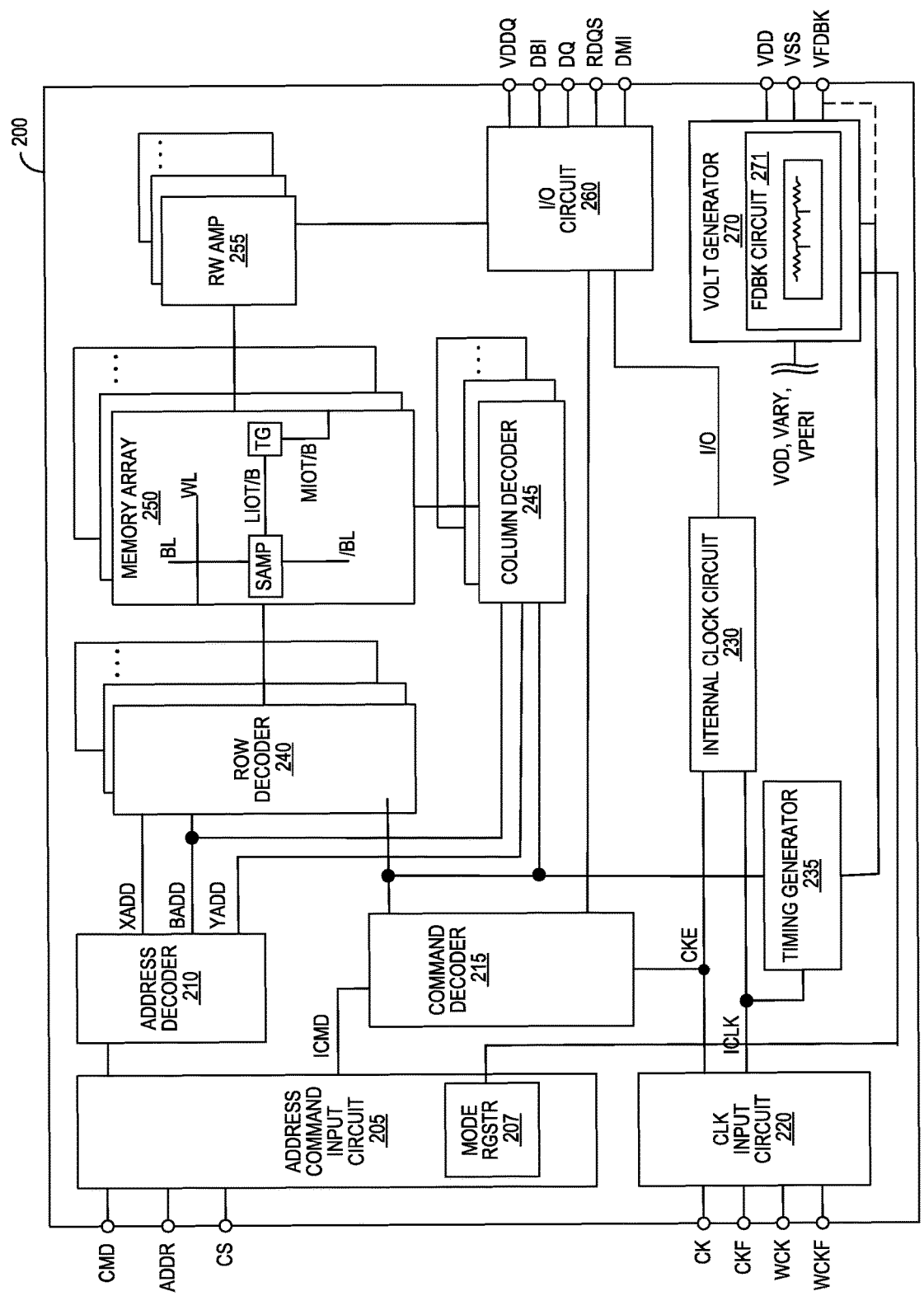
FIG. 2 illustrates a block diagram of an example memory apparatus in accordance with an embodiment of the present technology.

FIG. 2 illustrates a block diagram of an example memory apparatus 200 (e.g., a semiconductor die assembly, including a three-dimensional integration (3DI) device or a die-stacked package) in accordance with an embodiment of the present technology. For example, the apparatus 200 can include the DRAM 120 of FIG. 1 or a portion thereof.

The apparatus 200 may include an array of memory cells, such as memory array 250. The memory array 250 may include a plurality of banks (e.g., banks 0-15), and each bank may include a plurality of word-lines (WL), a plurality of bit lines (BL), and a plurality of memory cells arranged at intersections of the word-lines and the bit lines. Memory cells can include any one of a number of different memory media types, including capacitive, magnetoresistive, ferroelectric, phase change, or the like. The selection of a word-line WL may be performed by a row decoder 240, and the selection of a bit line BL may be performed by a column decoder 245. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches. The sense amplifiers and transfer gates may be operated based on control signals from decoder circuitry, which may include the command decoder 215, the row decoders 240, the column decoders 245, any control circuitry of the memory array 250, or any combination thereof. The memory array 250 may also include plate lines and corresponding circuitry for managing their operation.

The apparatus 200 may employ a plurality of external terminals that include command and address terminals coupled to a command bus and an address bus to receive command signals (CMD) and address signals (ADDR), respectively. The apparatus 200 may further include a chip select terminal to receive a chip select signal (CS), clock terminals to receive clock signals CK and CKF, data clock terminals to receive data clock signals WCK and WCKF, data terminals DQ, RDQS, DBI, and DMI, power supply terminals $V_{DD}$, $V_{SS}$, and $V_{DDQ}$.

The command terminals and address terminals may be supplied with an address signal and a bank address signal (not shown in FIG. 2) from outside. The address signal and the bank address signal supplied to the address terminals can be transferred, via a command/address input circuit 205, to an address decoder 210. The address decoder 210 can receive the address signals and supply a decoded row address signal (XADD) to the row decoder 240, and a decoded column address signal (YADD) to the column decoder 245. The address decoder 210 can also receive the bank address signal and supply the bank address signal to both the row decoder 240 and the column decoder 245.

The command and address terminals may be supplied with command signals (CMD), address signals (ADDR), and chip select signals (CS), from a memory controller. The command signals may represent various memory commands from the memory controller (e.g., including access commands, which can include read commands and write commands). The chip select signal may be used to select the apparatus 200 to respond to commands and addresses provided to the command and address terminals. When an active chip select signal is provided to the apparatus 200, the commands and addresses can be decoded, and memory operations can be performed. The command signals may be provided as internal command signals ICMD to a command decoder 215 via the command/address input circuit 205. The command decoder 215 may include circuits to decode the internal command signals ICMD to generate various internal signals and commands for performing memory operations, for example, a row command signal to select a word-line and a column command signal to select a bit line. The command decoder 215 may further include one or more registers for tracking various counts or values (e.g., counts of refresh commands received by the apparatus 200 or self-refresh operations performed by the apparatus 200).

Read data can be read from memory cells in the memory array 250 designated by row address (e.g., address provided with an active command) and column address (e.g., address provided with the read). The read command may be received by the command decoder 215, which can provide internal commands to input/output (I/O) circuit 260 so that read data can be output from the data terminals DQ, RDQS, DBI, and DMI via read/write amplifiers 255 and the I/O circuit 260 according to the RDQS clock signals. The read data may be provided at a time defined by read latency RL information that can be programmed in the apparatus 200, for example, in a mode register 207. The read latency RL information can be defined in terms of clock cycles of the CK clock signal. For example, the read latency RL information can be a number of clock cycles of the CK signal after the read command is received by the apparatus 200 when the associated read data is provided.

Write data can be supplied to the data terminals DQ, DBI, and DMI according to the WCK and WCKF clock signals. The write command may be received by the command decoder 215, which can provide internal commands to the I/O circuit 260 so that the write data can be received by data receivers in the I/O circuit 260 and supplied via the I/O circuit 260 and the read/write amplifiers 255 to the memory array 250. The write data may be written in the memory cell designated by the row address and the column address. The write data may be provided to the data terminals at a time that is defined by write latency WL information. The write latency WL information can be programmed in the apparatus 200, for example, in the mode register 207. The write latency WL information can be defined in terms of clock cycles of the CK clock signal. For example, the write latency information WL can be a number of clock cycles of the CK signal after the write command is received by the apparatus 200 when the associated write data is received.

The clock terminals and data clock terminals may be supplied with external clock signals and complementary external clock signals. The external clock signals CK, CKF, WCK, WCKF can be supplied to a clock input circuit 220. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 220 can receive the external clock signals. For example, when enabled by a clock/enable signal from the command decoder 215, an input buffer can receive the clock/enable signals. The clock input circuit 220 can receive the external clock signals to generate internal clock signals ICLK. The internal clock signals ICLK can be supplied to an internal clock circuit 230. The internal clock circuit 230 can provide various phase and frequency controlled internal clock signals based on the received internal clock signals ICLK and a clock enable CKE from the command/address input circuit 205. For example, the internal clock circuit 230 can include a clock path (not shown in FIG. 2) that receives the internal clock signal ICLK and provides various clock signals to the command decoder 215. The internal clock circuit 230 can further provide I/O clock signals. The I/O clock signals can be supplied to the I/O circuit 260 and can be used as timing signals for determining output timing of read data and/or input timing of write data. The I/O clock signals can be provided at multiple clock frequencies so that data can be output from and input to the apparatus 200 at different data rates. A higher clock frequency may be desirable when high memory speed is desired. A lower clock frequency may be desirable when lower power consumption is desired. The internal clock signals ICLK can also be supplied to a timing generator 235 and thus various internal clock signals can be generated.

The desired clock frequency and/or an upcoming change thereto can correspond to values in other registers. For example, one or more of the mode registers 207 can provide information associated with a targeted or required frequency range for upcoming memory operations. Also, one or more of the mode registers 207 (e.g., mode register 13) may be set before changing a frequency or a rate of the clock associated with the upcoming operation (e.g., data clock signal WCK/WCKF, the CK clock signal, and/or the internal clock signals ICLK). Accordingly, the corresponding mode register(s) 207 can be used to determine an upcoming change in the clock rate and/or the targeted range of the changed clock rate.

The power supply terminals may be supplied with power supply potentials $V_{DD}$ from an external source, such as an onboard voltage source (e.g., the PMIC 130 of FIG. 1). The power supply terminals can further access a voltage reference $V_{SS}$ (e.g., electrical ground). These power supply potentials $V_{DD}$ and $V_{SS}$ can be supplied to an internal voltage generator circuit 270. The internal voltage generator circuit 270 can generate various internal potentials $V_{OD}$, $V_{ARY}$, $V_{PERI}$, and the like based on the power supply potentials $V_{DD}$) and $V_{SS}$. The $V_{PP}$ can be used in the row decoder 240, the internal potentials Von and $V_{ARY}$ can be used in the sense amplifiers included in the memory array 250, and the internal potential $V_{PERI}$ can be used in many other circuit blocks.

The power supply terminal may also be supplied with power supply potential $V_{DDQ}$. The power supply potential $V_{DDQ}$ can be supplied to the I/O circuit 260 together with the power supply potential $V_{SS}$. The power supply potential $V_{DDQ}$ can be the same potential as the power supply potential $V_{DD}$ in an embodiment of the present technology. The power supply potential $V_{DDQ}$ can be a different potential from the power supply potential $V_{DD}$ in another embodiment of the present technology. However, the dedicated power supply potential $V_{DDQ}$ can be used for the I/O circuit 260 so that power supply noise generated by the I/O circuit 260 does not propagate to the other circuit blocks.

In some embodiments, the internal voltage generator circuit 270 can include a feedback circuit 271 configured to generate a feedback control indicator through a voltage feedback VFDBK connector/pad. The feedback circuit 271 can be configured to determine and communicate information associated with operating voltage/power, such as the external source levels (e.g., $V_{DD}$), one or more of the internal voltage levels (e.g., $V_{DD}$), and/or a derivation thereof. For example, the feedback circuit 271 can generate the feedback control indicator including a command or a setting for the external source levels. Also, the feedback circuit 271 can generate the feedback control indicator including a feedback reference voltage associated with the external source levels. The feedback circuit 271 can be configured to communicate the feedback control indicator to an external supply (e.g., the PMIC 130).

The feedback circuit 271 can be configured to determine a desired or required operating range of the clock frequency for ongoing and/or upcoming operations. For example, the feedback circuit 271 can access or monitor one or more of the mode registers 207 to determine the targeted clock frequency and/or an indication of an upcoming frequency change. Alternatively or additionally, the feedback circuit 271 can include circuitry (e.g., counters, asynchronous timeout circuits, match filters, etc.) configured to analyze internally-available information, such as clock speeds, incoming commands, and/or predetermined patterns thereof, to determine the clock frequency. Also, the feedback circuit 271 can include circuitry configured to interact with a phase-locked loop (PLL) circuit and/or the RCD 110 of FIG. 1 to determine the clock frequency.

The feedback circuit 271 can be configured to generate the feedback control indicator based on the determined clock frequency. The generated feedback control indicator can reflect a desired voltage level that corresponds to the targeted clock frequency instead of a current level. For example, the feedback circuit 271 can be configured (via, e.g., passive/active circuitry and/or processor/firmware/software) to generate commands/settings for increasing the external supply voltage for higher operating frequencies, such as when the operating mode matches one or more predetermined mode settings and/or the targeted frequency is above an upper threshold. The feedback circuit 271 can be configured to generate commands/settings for decreasing the external supply voltage for lower operating frequencies, such as when the operating mode matches one or more other mode settings and/or the targeted frequency is below a lower threshold. Also, for example, the feedback circuit 271 be configured (via, e.g., voltage dividers with taps and output switches) to generate a decreased feedback (e.g., a lower level than the actual current condition) for the higher operating frequencies and/or an increased feedback (e.g., a higher level than the actual current condition) for the lower operating frequencies. Accordingly, the external supply can respond to the adjusted feedback and increase the external supply levels for the higher operating frequencies and/or lower the external supply levels for the lower operating frequencies. In some embodiments, the feedback circuit 271 can be configured to provide the operating frequency range to the external source (e.g., the PMIC 130). The external source can increase and/or decrease the voltages according to the provided operating frequency range.

The apparatus 200 can be connected to any one of a number of electronic devices capable of utilizing memory for the temporary or persistent storage of information, or a component thereof. For example, a host device of apparatus 200 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to apparatus 200; although in other embodiments, the host device may be indirectly connected to memory device (e.g., over a networked connection or through intermediary devices).

Figure 3:
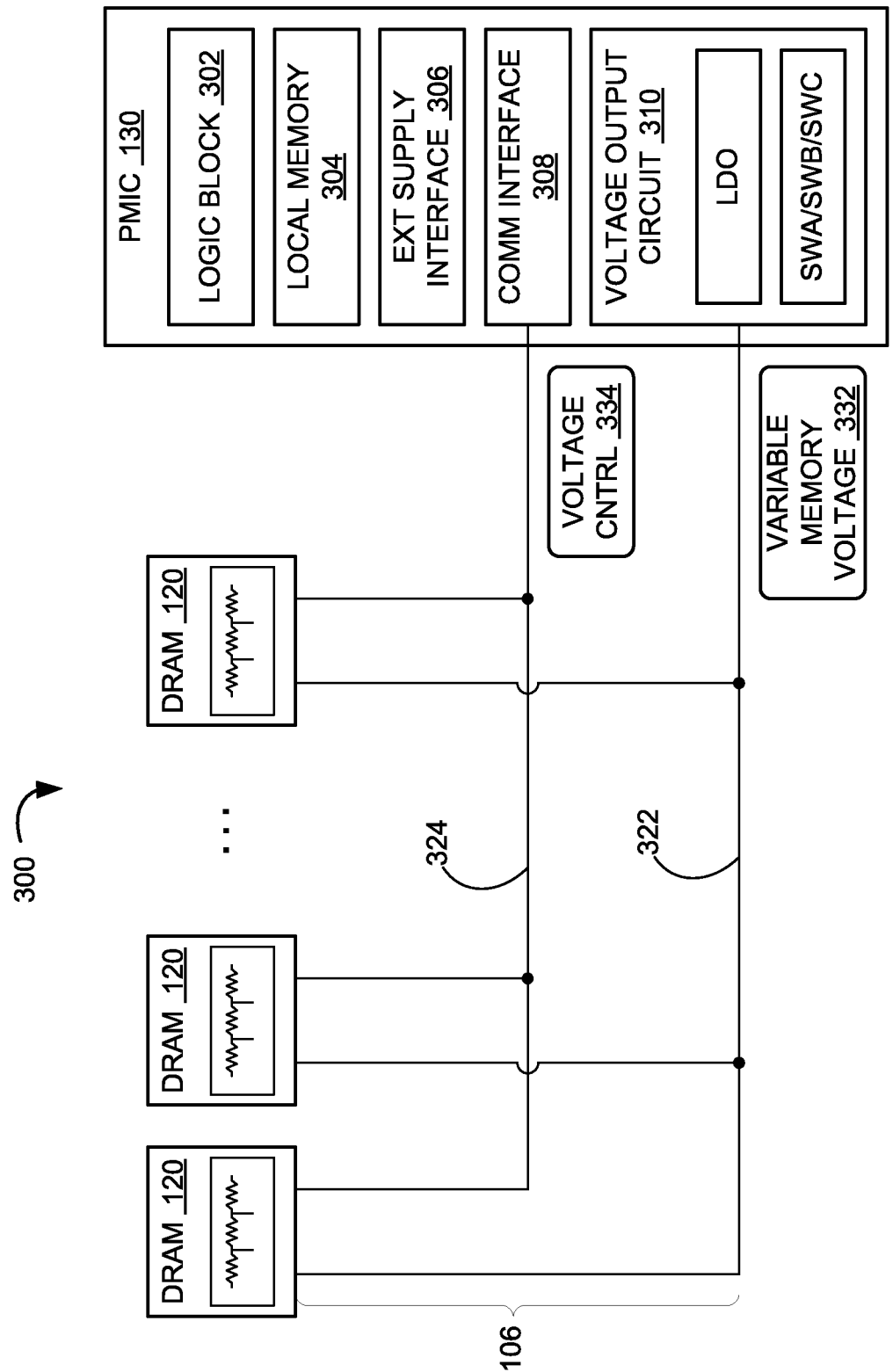
FIG. 3 illustrates a block diagram of a voltage-management circuit in accordance with an embodiment of the present technology.

FIG. 3 illustrates a block diagram of a voltage-management circuit 300 in accordance with an embodiment of the present technology. The voltage-management circuit 300 can include the DRAM 120, the PMIC 130, the service bus 106, and/or one or more portions therein. For example, the voltage-management circuit 300 can include the feedback circuit 271 of FIG. 2 and/or the mode register 207 of FIG. 2.

Alternatively or additionally the voltage-management circuit 300 can include one or more portions of a logic block 302, a local memory 304, an external supply interface 306, a communication interface 308, and/or a voltage output circuit 310 in the PMIC 130. The logic block 302 can be configured to control the operation of the PMIC 130. In some embodiments, the logic block 302 can operate according to circuitry configuration and/or instructions stored in the local memory 304. The local memory 304 can be further configured to store information (e.g., received data and/or processing results) during operation. The external supply interface 306 can be configured to receive and process (via, e.g., filters and/or voltage converters) input voltage, such as system voltage/current from a source external to the DIMM 100 of FIG. 1.

The voltage output circuit 310 can include circuitry (e.g., low-dropout (LDO) circuitry and/or step-down switching regulators (SWA, SWB, etc.)) configured to generate/provide variable memory voltage 332 for the DIMM 100. The service bus 106 can include one or more voltage supply connections 322 that provide the variable memory voltage 332 (e.g., $V_{DD}$) and/or $V_{SS}$) from the voltage output circuit 310 to the DRAM 120 (e.g., the internal voltage generator circuit 270 of FIG. 2 therein). The voltage output circuit 310 can provide the variable memory voltage 332 according to voltage control indicator 334 communicated to the communication interface 308 over one or more voltage control connections 324 within the service bus 106. As described above, the voltage control indicator 334 can include commands, settings, feedback voltage levels, and/or upcoming frequency ranges from the DRAM 120. The PMIC 130 can adjust the output levels of the variable memory voltage 332 according to the voltage control indicator 334. For example, based on the voltage control indicator 334, the PMIC 130 can increase the onboard voltage for higher operating frequencies and/or decrease the voltage for lower operating frequencies as described above.

Figures 4A, 4B:
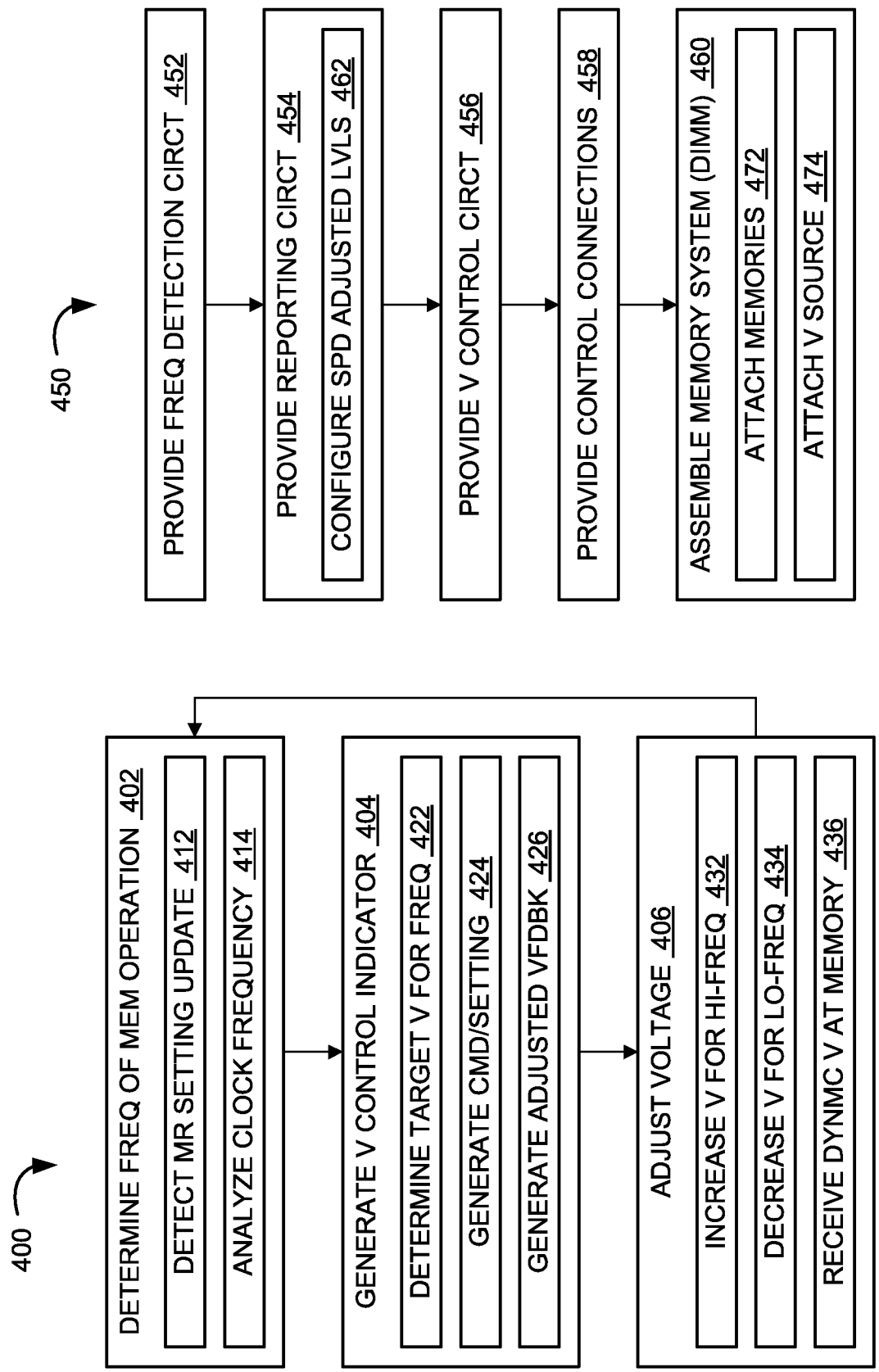
FIG. 4A is a flow diagram illustrating an example method of operating an apparatus in accordance with an embodiment of the present technology.
FIG. 4B is a flow diagram illustrating an example method of manufacturing an apparatus in accordance with an embodiment of the present technology.

FIG. 4A is a flow diagram illustrating an example method 400 of operating an apparatus (e.g., the DIMM 100 of FIG. 1, the DRAM 120 of FIG. 1, the PMIC 130 of FIG. 1, the voltage-management circuit 300 of FIG. 3, and/or one or more portions thereof) in accordance with an embodiment of the present technology. For example, the method 400 can be for dynamically adjusting the onboard voltage of the DIMM 100 (e.g., the variable memory voltage 332 of FIG. 3) according to a targeted frequency of a clock (e.g., data rate).

At block 402, the memory apparatus can determine a frequency associated with implementing a memory operation (e.g., a read or a write). In other words, the DRAM 120 or other circuitry on the DIMM 100 (e.g., the RCD 110 of FIG. 1) can determine a targeted frequency or a current frequency, such as a data rate, for an ongoing memory operation and/or an upcoming memory operation. For example, as illustrated at block 412, the DRAM 120 (via, e.g., the feedback circuit 271) can detect a mode register setting update that corresponds to the targeted frequency or a change therein. The DRAM 120 can monitor one or more of the mode registers 207 of FIG. 2 as described above to detect a change in the stored value. The DRAM 120 can use the detected change to determine the upcoming frequency range. Also, as illustrated at block 414, the DRAM 120 and/or the other circuitry can use an analysis circuitry to determine the frequency of a clock signal.

At block 404, the memory apparatus can generate the voltage control indicator 334 of FIG. 3 for adjusting the operating voltage supplied to the DRAM 120. At block 422, the memory apparatus can determine a target operating voltage that corresponds to the determined frequency. For example, the memory apparatus can target a higher voltage when the determined frequency is above a threshold (e.g., an upper threshold) and/or when the operating mode corresponds to the higher frequency. The memory apparatus can target the higher operating voltage for supporting the higher frequency and corresponding performance characteristics. Also, the memory apparatus can target a lower voltage when the determined frequency is below a threshold (e.g., a lower threshold) and/or when the operating mode corresponds to the lower frequency. The memory apparatus can target the lower voltage to reduce power consumption while supplying sufficient voltage to meet the reduced performance characteristics corresponding to the lower operating frequency.

In some embodiments, such as illustrated at block 424, the memory apparatus can generate a command or a setting (e.g., the voltage control indicator 334) according to the targeted operating voltage. For example, in some embodiments, the PMIC 130 can be configured to adjust the output/onboard voltage (e.g., the variable memory voltage 332) according to the generated command/setting. The DRAM 120 can generate and send the command/setting to the PMIC 130 for the targeted operating voltage.

In other embodiments, such as illustrated at block 426, the memory apparatus can generate an adjusted voltage feedback (e.g., the voltage control indicator 334) according to the targeted operating voltage. For example, in some embodiments, the PMIC 130 can be configured to maintain a targeted voltage at the DRAM 120 according to a feedback/reference voltage. The PMIC 130 can use the feedback/reference voltage as a representation of the output/onboard voltage provided to the DRAM 120. The feedback circuit 271 can generate a decreased voltage feedback for increasing the variable input voltage when the operating frequency is above a threshold (e.g., an upper threshold). The feedback circuit 271 can generate an increased voltage feedback for decreasing the variable input voltage when the operating frequency is below a threshold (e.g., a lower threshold). In other words, the feedback circuit 271 can generate the voltage control indicator 334 that tricks or forces the PMIC 130 to increase or decrease the output voltage above or below the targeted operating voltage.

As an illustrated example, the PMIC 130 can be configured to maintain the operating voltage of 'nV' at the DRAM 120. The PMIC 130 can be configured to receive or expect the voltage control indicator 334 (e.g., a scaled level of the operating voltage) that represents the operating voltage measured at the DRAM 120. When the determined current/upcoming operating frequency is above a threshold or when the corresponding operating modes are determined, the feedback circuit 271 can generate (via, e.g., the voltage divider with the selectable taps) the voltage control indicator 334 that corresponds to 'n−xV', even when the DRAM 120 operating voltage is 'nV'. When the PMIC 130 receives the adjusted voltage indication, the PMIC 130 can increase the output voltage by 'xV' in an effort to maintain 'nV' at the DRAM 120. In actuality, the PMIC 130 can output the increased voltage such that the operating voltage at the DRAM 120 is 'n+xV' according to the adjusted feedback. Similarly, when the determined current/upcoming operating frequency is below a threshold or when the corresponding operating modes are determined, the feedback circuit 271 can generate the voltage control indicator 334 that corresponds to 'n+xV', even when the DRAM 120 operating voltage is 'nV'. When the PMIC 130 receives the adjusted voltage indication, the PMIC 130 can decrease the output voltage by 'xV' in an effort to maintain 'nV' at the DRAM 120. In actuality, the PMIC 130 can output the decreased voltage such that the operating voltage at the DRAM 120 is 'n−xV' according to the adjusted feedback.

At block 406, the memory apparatus can adjust the operating voltage according to the voltage control indicator 334. For example, as illustrated at block 432, the PMIC 130 can increase the variable memory voltage 332 for the higher frequency (e.g., the determined frequency) associated with the upcoming operation and/or the ongoing operation. By increasing the variable memory voltage 332, the memory apparatus can meet the increased performance demand associated with the higher operating frequency (by, e.g., decreasing slew rates and/or voltage transitions). Also, as illustrated at block 434, the PMIC 130 can decrease the variable memory voltage 332 for the lower frequency (e.g., the determined frequency) associated with the upcoming operation and/or the ongoing operation. By decreasing the variable memory voltage 332, the memory apparatus can reduce the power consumption while maintaining reduced performance demand associated with the lower operating frequency. At block 436, the dynamically generated/adjusted variable memory voltage 332 can be provided to and received at the DRAM 120. As illustrated by the feedback loop in FIG. 4A, the apparatus 100 can repeat the method 400 and continuously adjust the operating voltage to optimally balance performance characteristics and power consumption.

FIG. 4B is a flow diagram illustrating an example method 450 of manufacturing an apparatus (e.g., the DIMM 100 of FIG. 1, the DRAM 120 of FIG. 1, the PMIC 130 of FIG. 1, the voltage-management circuit 300 of FIG. 3, and/or one or more portions thereof) in accordance with an embodiment of the present technology. At block 452, a frequency detection circuit can be provided. For example, the mode registers 207 of FIG. 2, the feedback circuit 271 of FIG. 2 or a portion thereof, a frequency analysis circuit, and/or associated connections can be provided. In some embodiments, providing a circuit can include forming circuitry components with semiconductor or integrated circuit manufacturing processes (including, e.g., doping, layering, depositing metal, planarizing, etc.). The provided or formed circuit can be configured to determine the operating frequency or a change thereto as described above.

At block 454, a reporting circuit (e.g., the feedback circuit 271 or one or more portions thereof) can be provided. The provided reporting circuit can be configured to generate the voltage control indicator 334 of FIG. 3 according to the determined frequency or a change thereof. The provided reporting circuit can be configured to communicate (via, e.g., one or more drivers) the voltage control indicator 334 to another circuit (e.g., an external device, such as the PMIC 130 of FIG. 1).

At block 456, a voltage control circuit (e.g., a variable voltage supply, such as the PMIC 130) can be provided. The provided voltage control circuit can have a feedback input for receiving the voltage control indicator 334. The voltage control circuit can be configured to use the voltage control indicator 334 to adjust the supplied output voltage as described above.

At block 458, control connections can be provided. For example, the substrate 101 of FIG. 1 can be provided with the service bus 106 of FIG. 1 including the voltage supply connections 322 of FIG. 3 and the voltage control connections 324 of FIG. 3. Alternatively, the voltage supply connections 322 and/or the voltage control connections 324 (e.g., metallic traces) can be formed (via, e.g., metal deposition) on the substrate 101. The provided connections can be configured to electrically couple and/or directly connect the DRAM 120 and the PMIC 130. In some embodiments, providing the control connections can include re-routing or adjusting sense lines on the DIMM substrate 101 to and/or from the DRAM 120. For example, when the PMIC 130 is configured to sense the operating voltage and/or receive the control indicator from the PCB, the substrate 101 can be reconfigured to connect the voltage feedback VFDBK connector/pad to the voltage control connections 324 and/or the PMIC 130.

At block 460, the memory system (e.g., the DIMM 100) can be assembled. For example, as illustrated at block 472, the memories (e.g., the DRAM 120) can be attached to the substrate 101. Also, as illustrated at block 474, the voltage source (e.g., the PMIC 130) can be attached to the substrate 101. The PMIC 130 and the DRAM 120 can be connected the service bus 106.

Figure 5:
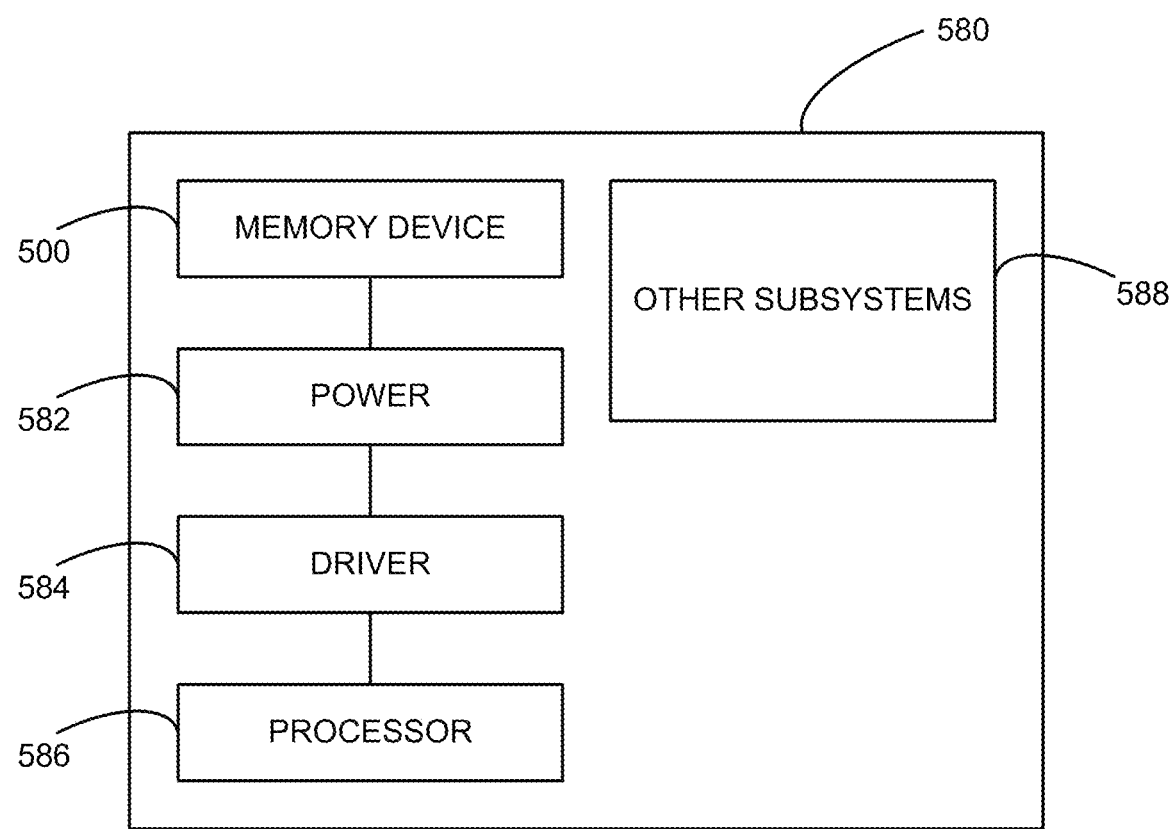
FIG. 5 is a schematic view of a system that includes an apparatus in accordance with an embodiment of the present technology.

FIG. 5 is a schematic view of a system that includes an apparatus in accordance with embodiments of the present technology. Any one of the foregoing apparatuses (e.g., memory devices) described above with reference to FIGS. 1-4 can be incorporated into any of a myriad of larger and/or more complex systems, a representative example of which is system 580 shown schematically in FIG. 5. The system 580 can include a memory device 500, a power source 582, a driver 584, a processor 586, and/or other subsystems or components 588. The memory device 500 can include features generally similar to those of the apparatus described above with reference to FIGS. 1-4, and can therefore include various features for performing a direct read request from a host device. The resulting system 580 can perform any of a wide variety of functions, such as memory storage, data processing, and/or other suitable functions. Accordingly, representative systems 580 can include, without limitation, hand-held devices (e.g., mobile phones, tablets, digital readers, and digital audio players), computers, vehicles, appliances and other products. Components of the system 580 may be housed in a single unit or distributed over multiple, interconnected units (e.g., through a communications network). The components of the system 580 can also include remote devices and any of a wide variety of computer readable media.

From the foregoing, it will be appreciated that specific embodiments of the technology have been described herein for purposes of illustration, but that various modifications may be made without deviating from the disclosure. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

In the illustrated embodiments above, the apparatuses have been described in the context of DIMM and DRAM devices. Apparatuses configured in accordance with other embodiments of the present technology, however, can include other types of suitable storage media in addition to or in lieu of DIMM and DRAM devices, such as, devices incorporating NAND-based or NOR-based non-volatile storage media (e.g., NAND flash), magnetic storage media, phase-change storage media, ferroelectric storage media, etc.

The term "processing" as used herein includes manipulating signals and data, such as writing or programming, reading, erasing, refreshing, adjusting or changing values, calculating results, executing instructions, assembling, transferring, and/or manipulating data structures. The term data structure includes information arranged as bits, words or code-words, blocks, files, input data, system-generated data, such as calculated or generated data, and program data. Further, the term "dynamic" as used herein describes processes, functions, actions or implementation occurring during operation, usage or deployment of a corresponding device, system or embodiment, and after or while running manufacturer's or third-party firmware. The dynamically occurring processes, functions, actions or implementations can occur after or subsequent to design, manufacture, and initial testing, setup or configuration.

The above embodiments are described in sufficient detail to enable those skilled in the art to make and use the embodiments. A person skilled in the relevant art, however, will understand that the technology may have additional embodiments and that the technology may be practiced without several of the details of the embodiments described above with reference to FIGS. 1-5.

What is claimed is:

1. A method, comprising:
   determining an operating frequency for one or more memory operations of a dynamic random access memory (DRAM) device;
   determining a target operating voltage for the DRAM device corresponding to the determined operating frequency;
   generating a setting for a power management device according to the target operating voltage, wherein the power management device adjusts a supply voltage to the DRAM device according to the setting; and
   communicating signals with the DRAM device for performing the one or more memory operations according to the determined operating frequency and the target operating voltage.

2. The method of claim 1, wherein determining the operating frequency comprises:
   monitoring a mode register associated with the DRAM device, wherein a value of the mode register indicates the operating frequency.

3. The method of claim 1, wherein the target operating voltage for the DRAM device comprises a lowest operating voltage of a set of operating voltages that is supported by the operating frequency of the DRAM device.

4. The method of claim 1, wherein the operating frequency corresponds to a clock signal associated with the DRAM device.

5. The method of claim 1, wherein the target operating voltage is less than a previous operating voltage for the DRAM device based at least in part on the operating frequency being less than a previous operating frequency for the DRAM device.

6. The method of claim 1, wherein the target operating voltage is greater than a previous operating voltage for the DRAM device based at least in part on the operating frequency being greater than a previous operating frequency for the DRAM device.

7. The method of claim 1, further comprising:
   receiving feedback that indicates the operating frequency of the DRAM device.

8. A method, comprising:
   outputting a first voltage to a dynamic random access memory (DRAM) device;
   monitoring a mode register of the DRAM device, wherein a value of the mode register indicates an operating frequency of the DRAM device; and
   adjusting the first voltage based at least in part on the value of the mode register, wherein the first voltage is adjusted to a second voltage that is different than the first voltage.

9. The method of claim 8, wherein the mode register indicates the operating frequency of the DRAM device and a target voltage level, and wherein adjusting the first voltage to the second voltage is based at least in part on the target voltage level.

10. The method of claim 8, wherein the operating frequency corresponds to a clock signal associated with the DRAM device.

11. The method of claim 8, wherein adjusting the first voltage comprises:
    decreasing the first voltage to the second voltage that is less than the first voltage based at least in part on the operating frequency being less than a previous operating frequency for the DRAM device.

12. The method of claim 8, wherein adjusting the first voltage comprises:
increasing the first voltage to the second voltage that is greater than the first voltage based at least in part on the operating frequency being greater than a previous operating frequency for the DRAM device.

13. The method of claim 8, further comprising:
identifying, at a first time, a first value of the mode register that indicates operation of the DRAM device according to a first operating frequency; and
outputting the first voltage to the DRAM device based at least in part on the first operating frequency, wherein the mode register changes from the first value to the value at a second time based at least in part on a change to operation of the DRAM device according to a second operating frequency, and wherein adjusting the first voltage to the second voltage is based at least in part on the change of the mode register.

14. A method, comprising:
operating according to a first operating frequency and a first supply voltage of a dynamic random access memory (DRAM) device;
monitoring a mode register of the DRAM device, wherein a value of the mode register indicates a second operating frequency for the DRAM device; and
operating according to the second operating frequency and a second supply voltage based at least in part on the value of the mode register.

15. The method of claim 14, further comprising:
switching operating modes of the DRAM device, wherein operating according to the second supply voltage is based at least in part on switching the operating modes of the DRAM device.

16. The method of claim 14, wherein the first operating frequency corresponds to a clock signal associated with the DRAM device.

17. The method of claim 14, wherein adjusting the first supply voltage comprises:
decreasing the first supply voltage to the second supply voltage that is less than the first supply voltage based at least in part on the second operating frequency being less than the first operating frequency for the DRAM device.

18. The method of claim 14, wherein adjusting the first supply voltage comprises:
increasing the first supply voltage to the second supply voltage that is greater than the first supply voltage based at least in part on the second operating frequency being greater than the first operating frequency for the DRAM device.

19. The method of claim 14, further comprising:
outputting feedback that indicates a change in the first operating frequency of the DRAM device based at least in part on the value of the mode register indicating the second operating frequency.

\* \* \* \* \*